(12) United States Patent
Mixon et al.

(10) Patent No.: US 9,470,747 B1
(45) Date of Patent: Oct. 18, 2016

(54) MISLINKED METER IDENTIFIER

(71) Applicant: Southern Company Services, Inc., Atlanta, GA (US)

(72) Inventors: Grayson Thomas Mixon, Pensacola, FL (US); Jack Charles Hierholzer, Pensacola, FL (US)

(73) Assignee: Southern Company Services, Inc., Atlanta, GA (US)

( * ) Notice: Subject to any disclaimer, the term of this patent is extended or adjusted under 35 U.S.C. 154(b) by 235 days.

(21) Appl. No.: 14/161,742

(22) Filed: Jan. 23, 2014

(51) Int. Cl.
*G01R 11/32* (2006.01)
*G01R 27/04* (2006.01)
*G08B 21/00* (2006.01)
*G01R 31/28* (2006.01)

(52) U.S. Cl.
CPC .................................. *G01R 31/2829* (2013.01)

(58) Field of Classification Search
CPC .................................................. G01R 31/2829
See application file for complete search history.

(56) References Cited

U.S. PATENT DOCUMENTS

2008/0106425 A1* 5/2008 Deaver ............ G01R 19/16547
340/646

\* cited by examiner

*Primary Examiner* — Jermele M Hollington
*Assistant Examiner* — Farhana Hoque
(74) *Attorney, Agent, or Firm* — Thomas|Horstemeyer, LLP

(57) ABSTRACT

Various methods and systems are directed to a mislinked meter system that identifies utility meters mislinked to a distribution transformer in a data store. Utility meters reporting voltages that vary more than other meters linked to the same distribution transformer in the data store may be physically linked to a different distribution transformer. To compare meter voltages, the mislinked meter system generates normal meter errors for the utility meters and a normal transformer error for some or all of the utility meters linked to the same distribution transformer. The normal meter error and transformer error represent the amount the voltages of a utility meter varies from the voltages of the other utility meters associated with the distribution transformer. The more the meter errors vary when compared to the transformer error, the more likely a utility meter is mislinked to the wrong distribution transformer in the data store.

20 Claims, 7 Drawing Sheets

| Time | Voltage | | | | |
|---|---|---|---|---|---|
| | Meter A | Meter B | Meter C | | Average |
| 6:00 p.m. | 248 | 246 | 244 | | 246 |
| 7:00 p.m. | 246 | 248 | 246 | | 246.6667 |
| 8:00 p.m. | 248 | 246 | 248 | | 247.3333 |
| 9:00 p.m | 246 | 246 | 244 | | 245.3333 |
| 10:00 p.m. | 246 | 248 | 242 | | 245.3333 |

301

| Time | Periodic Meter Errors (\|Average Voltage - Voltage\|) | | |
|---|---|---|---|
| | Meter A | Meter B | Meter C |
| 6:00 p.m. | 2 | 0 | 2 |
| 7:00 p.m. | 0.666667 | 1.333333 | 0.666667 |
| 8:00 p.m. | 0.666667 | 1.333333 | 0.666667 |
| 9:00 p.m | 0.666667 | 0.666667 | 1.333333 |
| 10:00 p.m. | 0.666667 | 2.666667 | 3.333333 |
| | | | |
| Meter Error | 0.933333 | 1.2 | 1.6 |

311

| | Transformer Error |
|---|---|
| Substation A | 1.244444444 |

321

| | Normalized Meter Error |
|---|---|
| Meter A | 0.75 |
| Meter B | 0.964285714 |
| Meter C | 1.285714286 |

MISLINKED METER IDENTIFIER

BACKGROUND

A utility metering and computing environment may involve storage, analysis, and manipulation of large amounts of data. The utility metering and computing environment may be tasked with monitoring millions of utility metering devices transmitting usage data on a periodic or real-time basis. The various utility metering devices may be associated with various customer accounts, account types, service plans, and other categories.

Each one of the utility metering devices may be physically linked to a distribution transformer. When the utility metering device is installed or changed, a link between the distribution transformer and the utility metering device is recorded in a data store. Upon entry into the data store, the utility metering device may be mislinked to a distribution transformer different from the physically linked distribution transformer. Utility outage issues, sizing analysis for the transformers, power flow studies, deployment of resources, and other operations rely on the customer information system.

BRIEF DESCRIPTION OF THE DRAWINGS

Many aspects of the present disclosure may be better understood with reference to the following drawings. The components in the drawings are not necessarily drawn to scale, emphasis instead being placed upon clearly illustrating the principles of the present disclosure. Moreover, in the drawings, like reference numerals designate corresponding parts throughout the several views.

FIG. 3 is an example of identification of a mislinked meter in a data store implemented in the utility metering and computing environment of FIG. 1, according to various embodiments of the present disclosure.

DETAILED DESCRIPTION

Figure 1:
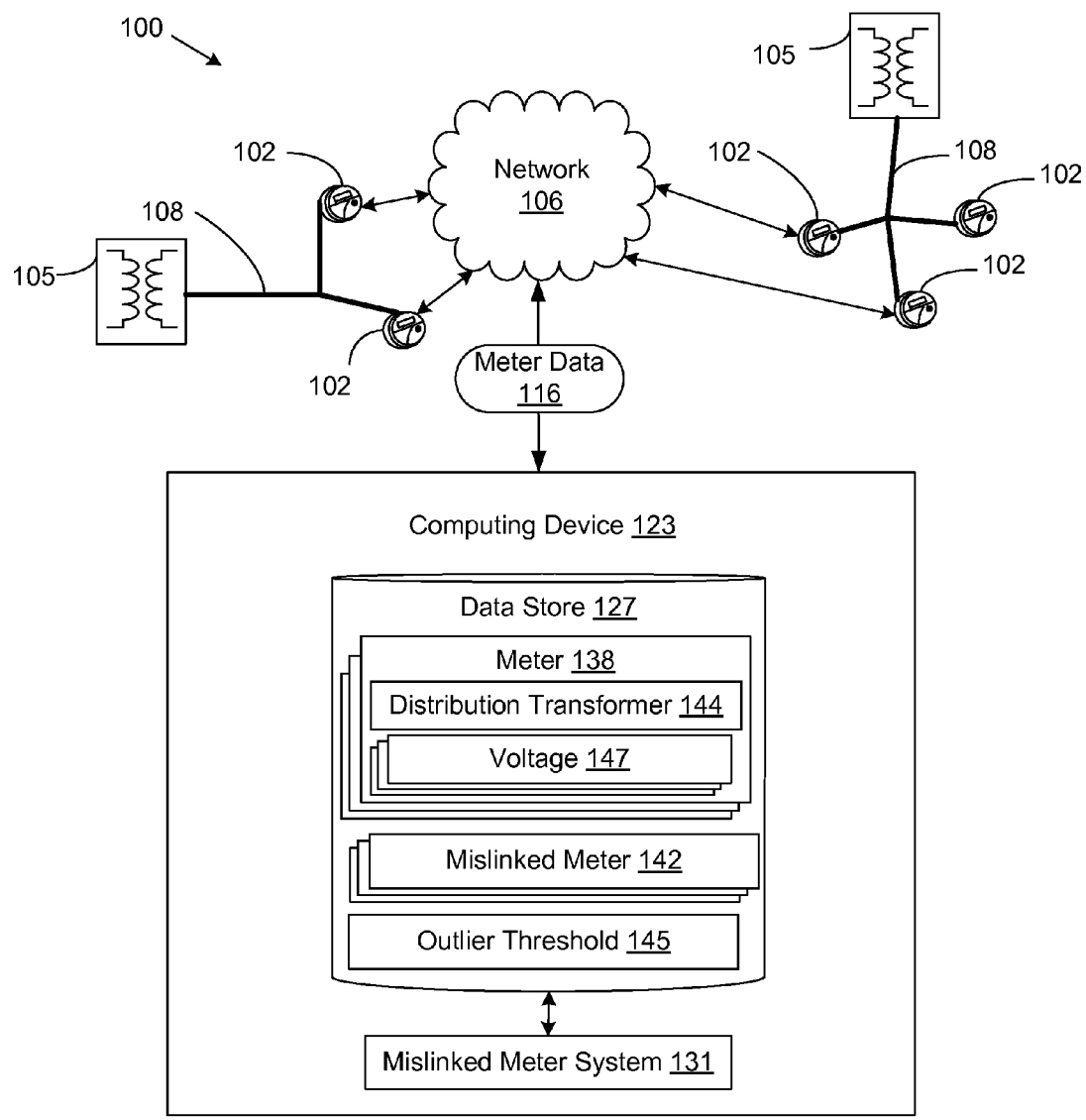
FIG. 1 is a drawing of a utility metering and computing environment in which a mislinked meter system may be implemented according to various embodiments of the present disclosure.

Disclosed herein are various embodiments of systems and methods related to a mislinked meter system that provides an automated system that identifies meters mislinked to distribution transformers in a data store. A data representation of a meter is mislinked to the wrong data representation of a distribution transformer when the data representation of a meter corresponds to a physical utility metering device 102 that is physically linked to a physical distribution transformer 105 (FIG. 1) but the data representation of the meter 138 is linked to the data representation of a different distribution transformer 144 in the data store 127. The mislinked meter system generates data from voltage data generated by the meters and identifies meters that are physically linked to a different distribution transformer than the one identified in a data store. The mislinked meter system may be referred to as a "Mislinked Meter Identifier." Meters incorrectly identified in the data store as linked to a distribution transformer different from the distribution transformer physically linked to the utility metering device may cause delays and other problems with utility outage resolution, sizing analysis for the transformers, power flow studies, deployment of resources, and other operations that rely on the data showing a meter mislinked to a distribution transformer.

The mislinked meter identifier may obtain voltages for utility metering devices identified in the data store as linked to a distribution transformer. According to various embodiments, the mislinked meter identifier generates data from these voltages to identify the utility metering devices that are potentially mislinked to the wrong distribution transformer in the data store. The data for utility metering devices physically linked to the same distribution transformer reflects approximately the same voltage for each of the utility metering devices unless one of the utility metering devices is physically linked to another distribution transformer. In the case of a mislinked utility metering device, the data generated from the voltages reflect more variance than the data generated from voltages of utility metering devices correctly linked to the distribution transformer. Examples of such data may include interpolated voltage levels to estimate voltage levels more often than what is reported by the utility metering devices. For example, the utility metering devices may provide voltage levels every four hours. The mislinked meter identifier may then interpolate voltage levels for every hour, for example, from the data reported by the utility metering devices.

Another example of data generated by the mislinked meter identifier includes periodic meter errors for the utility metering devices. For example, the mislinked meter identifier may generate periodic meter errors based at least in part on a difference between an average of the voltages and one of the voltages at a periodic interval associated with a utility metering device. For instance, the mislinked meter identifier may generate a periodic meter error for every hour based at least in part on a difference between an average of voltages and the voltage at each hour.

The mislinked meter identifier may generate data pertaining to an average meter error based at least in part on an average of the periodic meter errors associated with a utility metering device. The mislinked meter identifier may then generate a transformer error based at least in part on an average of the meter errors of the utility metering devices linked to the distribution transformer. A ratio of the transformer error to the meter error of a utility metering device may reveal a normalized meter error showing a variation substantial enough to indicate that, although the utility metering device is linked to the distribution transformer in the data store, the utility metering device is not physically linked to the distribution transformer. An investigator may then verify whether a physical connection exists between the utility metering device and the distribution transformer identified in the data store as linked to the utility metering device.

Referring to FIG. 1, shown is a drawing of a utility metering and computing environment 100, according to various embodiments of the present disclosure. The utility metering and computing environment 100 comprises one or more utility metering devices 102. Non-limiting examples of utility metering devices 102 include smart meters, automated reconnect/disconnect (RCDC) meters, advanced metering infrastructure (AMI) meters, or any other devices that are operable to monitor consumption of utility resources. A utility metering device 102 may be operable to measure and store utility consumption data and/or signal events. Non-limiting examples of signal events include a power outage indication, a meter tamper indication, a low voltage indication, a power restore indication, or any other indication of meter status. In some embodiments, a utility metering device 102 comprises a device that monitors or tracks operations of portions of a utility system. For example, the utility metering device 102 may monitor the operations of various utility infrastructure components such as, for example, capacitor banks, switch components, or any other physical device that effectuates the operation of the utility system. In other embodiments, the utility metering device 102 monitors patterns in utility usage at a consumer site to identify improper usage, defects in a metering device, meter theft, or any other issue associated with utility usage at a customer site. Each utility metering device 102 is physically linked to a distribution transformer 105 via a service drop 108. Each utility metering device 102 may be configured for bi-directional communication via a network 106.

The network 106 may comprise, for example, the Internet, intranets, wide area networks (WANs), local area networks (LANs), wireless networks, other suitable networks, or any combination of two or more such networks. The network 106 may comprise one or more base stations that relay data to and from the utility metering devices 102.

The utility metering and computing environment 100 may comprise a computing device 123. The computing device 123 may comprise, for example, a server computer or any other system providing computing capability. Alternatively, the computing device 123 may employ a plurality of computing devices that may be arranged, for example, in one or more server banks, computer banks, or other arrangements. Such computing devices may be located in a single installation or may be distributed among many different geographical locations. For example, the computing device 123 may include a plurality of computing devices 123 that together may comprise a cloud computing resource, a grid computing resource, and/or any other distributed computing arrangement. In some cases, the network 106 may correspond to an elastic computing resource where the allotted capacity of processing, network, storage, or other computing-related resources may vary over time.

In various embodiments, the computing device 123 may receive meter data 116 from the network 106. The meter data 116 may comprise, for example, meter readings, voltages, utility metering device identifiers, status information regarding one or more utility metering devices 102, or any other information relating to one or more utility metering devices 102.

Various applications, application layers, software modules, and/or other functionality may be executed in the computing device 123 according to various embodiments.

Also, various data is stored in a data store 127 that is accessible to the computing device 123. The data store 127 may be representative of a plurality of data stores 127 as can be appreciated. The data stored in the data store 127 is associated with, for example, the operation of the various applications, application layers, software modules, and/or functional entities described below.

The components executed on the computing device 123 include, for example, a mislinked meter system 131 and other applications, services, processes, systems, engines, or functionality not discussed in detail herein. The mislinked meter system 131 may perform various functions to identify meters mislinked to the wrong distribution transformer 144 in the data store 127. For example, the mislinked meter system 131 may generate averages and error rates from voltages 147 that indicate whether a meter 138 has been mislinked to a distribution transformer 144.

The data stored in the data store 127 includes at least data related to meters 138 and mislinked meters 142. Meters 138 may comprise data related to the physical utility metering devices 102. For example, meters 138 may comprise distribution transformer 144 and voltages 147. Distribution transformer 144 corresponds to data related to the physical distribution transformer 105. Distribution transformer 144 is stored in the data store 127 as linked to meter 138 when the physical utility metering device 102 corresponding to the meter 138 was installed. Upon entry of distribution transformer 144, an error may occur that mislinks meter 138 to the wrong distribution transformer 144.

Meter 138 may further comprise voltages 147. Voltages 147 may be readings sent by the utility metering devices 102 as part of meter data 116 via network 106 to the computing device 123. In various embodiments, voltages 147 may be interpolated by the mislinked meter system 131 from readings sent by utility metering devices 102.

The data store 127 may further comprise one or more mislinked meters 142. Mislinked meters 142 may include data pertaining to meters 138 that have been mislinked to the wrong distribution transformer 144. For example, if a meter 138 is identified as linked to distribution transformer 144 but the physical utility metering device 102 corresponding to the respective meter 138 is linked to a physical distribution transformer 105 different from the physical distribution transformer 105 corresponding to distribution transformer 144, the meter 138 may be added as a mislinked meter 142.

The data store 127 may further comprise an outlier threshold 145. The outlier threshold 145 may be a predefined threshold for identifying which meters 138 are mislinked meters 142. For example, the mislinked meter system 131 may generate errors for the meters 138 that reflect how much the voltage of each one of the meters 138 varies from normal meters 138 associated with a distribution transformer 144. Meters 138 that have an error that meets or exceeds the outlier threshold 145 may be identified as mislinked.

Next, a general description of the operation of the various components of the utility metering and computing environment 100 is provided. To begin, utility metering devices 102 monitor and/or track a consumption of a utility resource with respect to a customer. A utility metering device 102 may transmit meter readings comprising voltages via the network 106 to a computing device 123. For example, a meter reading may be forwarded to one or more base stations within the network 106 and then subsequently forwarded to one or more computing devices 123. A utility metering device 102 may also forward any information relating to the status of the utility metering device 102, control signals relating to the operation of the utility metering device 102, any measurement data collected by the utility metering device 102, or any other information relating to the operation of the utility metering device 102. Information received by a utility metering device 102 may be stored in a data store 127 of the computing device 123.

Meter data 116 may be transmitted from one or more meters 102 to a computing device 123 via the network 106. The meter data 116 may be transmitted at periodic intervals, in real-time, and/or in response to a request for the meter data 116. Thus, the meter data 116 may be pushed to a data store 127 of the computing device 123. The meter data 116 may comprise, for example, information relating to one or more utility metering devices 102 or measurements generated by one or more utility metering devices 102, such as voltage levels. By receiving the meter data 116, the computing device 123 tracks and stores information regarding utility metering devices 102.

The mislinked meter system 131 is executed in the computing device 123 to facilitate identification of meters 138 that are mislinked to distribution transformers 144 in the data store 127. Physical utility metering devices 102 physically linked a physical distribution transformer 105 exhibit similar voltage deviations. If a meter 138 is mislinked to a distribution transformer 144 in the data store 127, the voltage deviation of the mislinked meter 138 will vary differently from the meters 138 that are linked to the distribution transformer 144 that corresponds to the correct physical distribution transformer 105. Thus, the mislinked meter system 131 evaluates voltages 147 for meters 138 linked to a distribution transformer 144 to determine which meters 138 vary more than other meters 138 and are therefore more likely to be mislinked to the distribution transformer 144.

The mislinked meter system 131 identifies meters 138 having voltages 147 that vary more than normal for the meters 138 associated with the same distribution transformer 144. For example, the mislinked meter system 131 may generate averages from the voltages 147 and compare the averages for each of the meters 138 to other meters 138. In this example, those meters 138 having outlying averages may be identified as mislinked meters 142.

The meter data 116 transmitting by the meters 102 may contain infrequent voltage levels. For example, the voltage levels reported by the utility metering devices 102 may be reflect voltages captured every four hours. The mislinked meter system 131 may interpolate more voltages from the reported voltages in the meter data 116. Advantages of more frequent voltage levels may include more accurate comparisons by minimizing the significance of a single inaccurate outlying voltage, and thus more accurate identification of mislinked meters 142.

To increase further the likelihood of accurate identification of mislinked meters 142, the mislinked meter system 131 may generate a periodic normal of the voltages of all or some meters 138 linked to the same distribution transformer 144. For example, the mislinked meter system 131 may average all of the voltages 147 for all of the meters 138 corresponding to 1:00 p.m., 2:00 p.m., and 3:00 p.m. Thus, the mislinked meter system 131 generates a normal for each one of the meters 138 at each of these times. Using this periodic average, the mislinked meter system 131 may generate a periodic meter error for each one of the meters 138 at each period. For example, the mislinked meter system 131 may generate a periodic meter error at 1:00 p.m. by subtracting the periodic meter average at 1:00 p.m. from the voltage 147 at 1:00 p.m. The periodic meter errors represent a periodic deviation from the normal voltage for a utility metering device 102. The mislinked meter system 131 may average the periodic meter errors for a meter 138 over a period of time to generate an average periodic meter error. The average periodic meter error represents the normal voltage deviation for a meter 138 over a timespan.

The mislinked meter system 131 identifies mislinked meters by identifying which meters 138 differ from the average more than other meters 138. To gain insight into how each meter 138 compares to other meters 138 linked to a distribution transformer 144, the mislinked meter system 131 may generate a transformer error to represent the normal voltage deviation of all or some meters 138 linked to a distribution transformer 144. For example, the mislinked meter system 131 may generate a transformer error by averaging the average periodic meter errors for each meter 138 linked to the distribution transformer 144. The transformer error represents an average amount of voltage deviation for meters 138 linked to the distribution transformer 144.

Some amount of voltage deviation occurs due to voltage drop between a transformer at the physical distribution transformer 105 and utility metering devices 102. The mislinked meter system 131 may generate a normalized meter error to reflect the normal voltage deviation for a meter 138 when the meter 138 is compared to other meters 138. For example, a ratio between the meter error and the transformer error for a meter 138 may reflect the normal amount of error for the meter 138 in view of other meters 138. In this example, a normalized meter error of 1 reflects a meter 138 that has the same amount of voltage deviation as the average amount of deviation for all or some meters 138 linked to the distribution transformer 144. In other words, the meter 138 with a normalized meter error of 1 is as likely to be linked, or mislinked, to the distribution transformer 144 as all of the meters 138 analyzed in the transformer error. Continuing the example, where the normalized meter error is a ratio between the meter error and transformer error, the greater the value, the more likely the meter 138 is to be mislinked to the distribution transformer 144 because most utility metering devices 102 physically linked to a physical distribution transformer 105 have a similar voltage drop or deviation. The higher the normalized meter error, the more the meter 138 varies more than the average meter 138 allegedly linked to the distribution transformer 144. The more a meter 138 deviates, the more likely it is mislinked to the wrong distribution transformer 144 in the data store 127.

The mislinked meter system 131 may then add meters 138 associated with normalized meter errors above a threshold to a list of mislinked meters 142. For example, the mislinked meter system 131 may add all or some meters 138 having a normalized meter error above 1 to the mislinked meter list 142. Thus, some meters 138 on a list of mislinked meters 142 may not be mislinked to the wrong distribution transformer 144 since some deviation from the average transformer error may occur. The amount of acceptable deviation depends on the threshold. Additional verification of whether the mislinked meters 142 are mislinked to the wrong distribution transformer 144 may be necessary.

Figure 2:
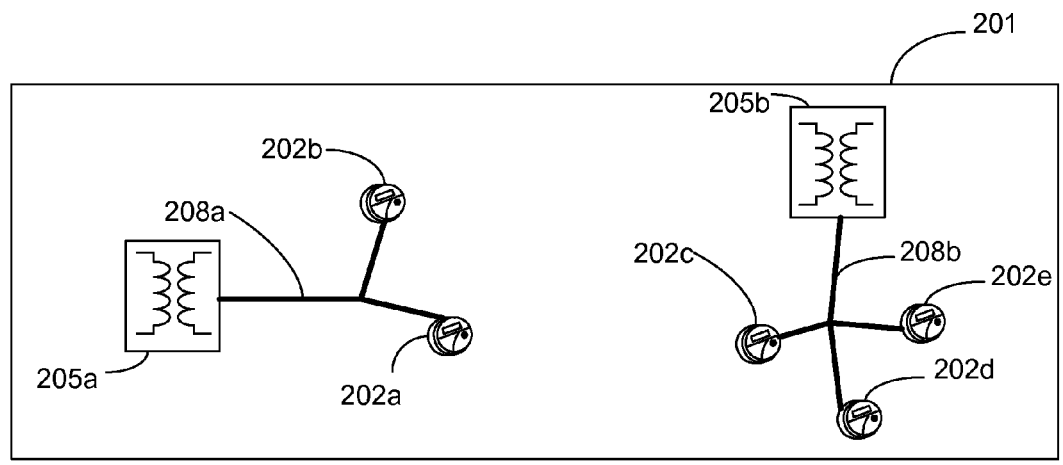
FIG. 2 is an example of a physical representation of utility metering devices linked to distribution transformers and a geographic information system model linking the utility metering devices to the distribution transformers recorded in the utility metering and computing environment of FIG. 1, according to various embodiments of the present disclosure.

Referring next to FIG. 2, shown is a utility metering device deployment map 201 and data 211 representing the links between meters 138 (FIG. 1) and distribution transformers 144 (FIG. 1) in the data store 127 (FIG. 1). Unless a meter 138 is mislinked to the wrong distribution transformer 144 in the data store 127, the links in the data 211 should correspond to the links between the utility metering devices 202a-202e and the physical distribution transformers 205a and 205b in the utility metering device deployment map 201. In the utility metering device deployment map 201, utility metering devices 202a and 202b are physically linked via a service drop 208a to distribution transformer 205a. Furthermore, utility metering devices 202c-202e are physically linked via service drop 208b to distribution transformer 205b.

Continuing with FIG. 2, the data 211 shows that Meters A, B, and C are linked to distribution transformer A in the data store 127. Meter C is input into the data store 127 as a meter 138 and corresponds to utility metering device 202c in the utility metering device deployment map 201. In data 211, Meter C is linked to distribution transformer A. Distribution transformer A is input into the data store 127 as a distribution transformer 144 and corresponds to physical distribution transformer 205a. Also in data 211 is distribution transformer B, which corresponds to physical distribution transformer 205b in the utility metering device deployment map 201. Thus, Meter C is mislinked to distribution transformer A in the data store 127 since utility metering device 202c, which corresponds to the meter 138 that corresponds to Meter C in the data store 127, is physically linked to distribution transformer 205, which corresponds to the distribution transformer 144 that corresponds to Transformer B in the data store 127.

Moving to FIG. 3, shown is an example of the mislinked meter system 131 implemented in the utility metering and computing environment 100 of FIG. 1, according to various embodiments of the present disclosure. The mislinked meter system 131 generates data from voltage levels for Meters A, B, and C to verify that Meters A, B, and C are linked to the same distribution transformer as reflected in the data store 127 (FIG. 1). Meters A, B, and C are linked to the same distribution transformer 144 (FIG. 1) in the data store 127. Meters 138 (FIG. 1) that are correctly linked to the same distribution transformer 144 exhibit similar deviations in voltages whereas meters 138 that are mislinked have voltages that vary more than normal.

The mislinked meter system 131 generates various data to determine the normal voltage deviations for meters 138 linked to a same distribution transformer 144 and to compare each meter 138 to the normal deviations of other meters 138 linked to the same distribution transformer 144. For example, for the mislinked meter system 131 to identify meters 138 that vary more than other meters 138, the mislinked meter system 131 must generate data that accurately compares the individual meter 138 to the meters 138 associated with a distribution transformer 144 as a whole. In various embodiments, the comparison may be the average voltage deviation of the individual meter 138 to the average voltage deviation of all or some meters 138 linked to the same distribution transformer 144. To generate voltage deviations, the mislinked meter system 131 may generate voltage averages to provide insight into the average voltage level of a meter at a period in time. The mislinked meter system 131 may then generate a meter error that reflects the deviation of the meter 138 from the average voltage level. Examples of these voltage averages and voltage deviations are provided in FIG. 3.

In FIG. 3, chart 301 shows voltages for Meters A, B, and C. Meters A, B, C correspond to meters 138 in the data store 127. In various embodiments, the mislinked meter system 131 may have obtained the voltages in chart 301 from the data store 127. The voltages 147 (FIG. 1) in the data store 127 may have been obtained from meter data 116 (FIG. 1) sent from utility metering devices 102 (FIG. 1). In various embodiments, the voltages in chart 301 may have been interpolated from voltages 147 in the data store 127. For example, the voltages 147 may represent voltage levels every four hours. The mislinked meter system 131 may interpolate voltages for hourly levels. This may increase accuracy by minimizing the effects of an abnormal voltage level. The interpolation of voltages may be linear interpolation, spline interpolation, polynomial interpolation, or any method by which intermediate voltages may be estimated.

Continuing with chart 301 in FIG. 3, the mislinked meter system 131 generates voltage averages for each period of time. For example, at 6:00 p.m., the voltage average is 246. This periodic voltage average represents the normal voltage level for all of the meters 138 linked to the same distribution transformer 144 at a period of time. The periodic voltage averages over a timespan represent a curve of normal voltage usage among the meters 138 linked to the same distribution transformer 144. For example, in chart 301, the periodic voltage averages depict the normal voltage levels for Meters A, B, and C hourly from 6:00 p.m. to 10:00 p.m.

Continuing with FIG. 3, the mislinked meter system 131 generates a periodic meter errors chart 311 to reflect the deviation of each meter 138 from the normal voltage of all or some meters 138 associated with a distribution transformer 144 at each period of time. For example, at 6:00 p.m., Meter A deviates by 2 volts from the average voltage of Meters A, B, and C at 6:00 p.m. To increase accuracy by minimizing the effect of an abnormal voltage, the mislinked meter system 131 then generates an average of the deviations of each meter 138 over a period of time, called a meter error. For example, Meter A has a meter error of 0.9333 from 6:00 p.m. until 10:00 p.m. This represents an average deviation of 0.9333 from the normal voltage over the time span between 6:00 p.m. until 10:00 p.m. Meter errors reflect the normal voltage deviation of each meter 138 linked to the same distribution transformer 144. To determine whether a meter 138 is mislinked to the wrong distribution transformer 144, the mislinked meter system 131 compares the meter 138 to other meters 138.

In various embodiments, the mislinked meter system 131 generates a normal voltage deviation for all or some meters 138 associated with the same distribution transformer 144 for comparison to individual meters 138 to identify mislinked meters 142 (FIG. 1). For example, the mislinked meter system 131 may average the meter errors for meters 138 associated with the same distribution transformer 144 to generate a transformer error 321. The transformer error 321 represents the normal voltage deviation of all or some meters 138 associated with the distribution transformer 144 by averaging the normal deviations of the respective meters 138. In alternative embodiments, the mislinked meter system 131 may generate a normal voltage deviation for meters 138 by generating a standard deviation of meter errors or another value that represents the deviation of the all or some meters 138 associated with the same distribution transformer 144.

Continuing with FIG. 3, the mislinked meter system 131 generates a normalized meter error 331 for each meter 138 to identify which meters 138 vary more than other meters 138 and therefore are likely mislinked to the wrong distribution transformer 144. The normalized meter error 331 represents the comparison between each meter 138 and all or some meters 138 associated with a distribution transformer 144. For example, the mislinked meter system 131 may generate a ratio between the meter error and transformer error for each meter 138. For Meter A in FIG. 3, the normalized meter error is 0.75, or the ratio between the meter error of 0.933 for Meter A and the transformer error 321 of 1.244.

When the mislinked meter system 131 generates the normalized meter error 331 as a ratio, a value of 1 represents a normal meter because the meter error equals the transformer error 321, which is the normal error for all or some meters 138 linked to the distribution transformer 144. A value of less than 1 means the meter 138 is less likely to be mislinked than the normal meter 138 linked to the distribution transformer 144 because the normalized meter error 331 is less than the transformer error 321. A value of more than 1 means the meter 138 is more likely to be mislinked than a normal meter 138 because the normalized meter error 331 is greater than the transformer error 321. Moreover, the greater the normalized meter error 331, the more likely the meter 138 is mislinked to the distribution transformer 144 because the normalized meter error 331 represents a larger deviation from the normal meter 138. For example, Meter C has a normalized meter error 331 of approximately 1.286, which means it is more likely to be mislinked than a normal meter associated with the same distribution transformer 144.

Once the normalized meter errors 331 for all or some meters 138 associated with the same distribution transformer 144 are generated, the mislinked meter system 131 may identify ones of the meters 138 most likely mislinked. For example, Meter C may be mislinked because it has a normalized meter error 331 of approximately 1.286. To determine which meters 138 to identify as mislinked, the mislinked meter system 131 may identify all or some meters 138 with a normalized meter error above a predefined outlier threshold 145 (FIG. 1). In various embodiments, the mislinked meter system 131 may identify meters 138 having normalized meter errors 331 in a top percentile. For example, the mislinked meter system 131 may identify meters 138 having a top 25% normalized meter error 331 of all normalized meter errors 331 of meters 138 associated with the distribution transformer 144. The identified mislinked meters may be stored in the data store 127 as mislinked meters 142 for verification by a field representative.

Figure 4:
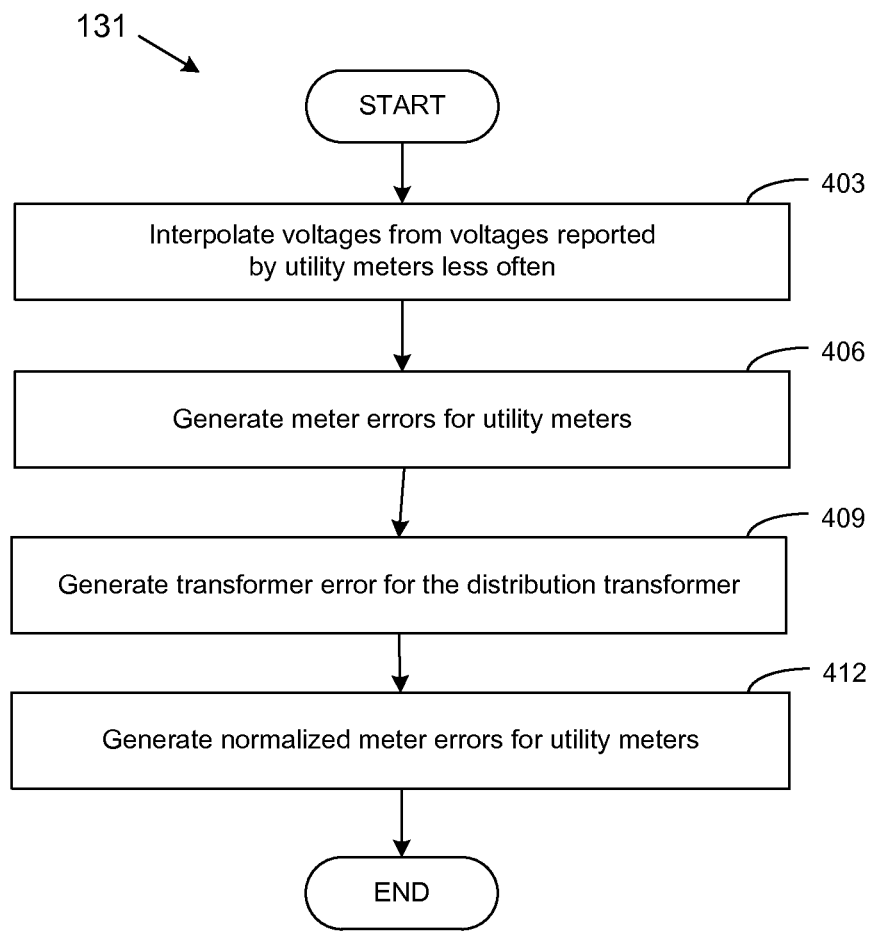
FIG. 4 is a flowchart illustrating one example of functionality implemented as portions of the mislinked meter system executed in the utility metering and computing environment of FIG. 1.

Turning now to FIG. 4, shown is a flowchart that provides one example of the operation of a portion of the logic executed by the mislinked meter system 131, according to various embodiments. It is understood that the flowchart of FIG. 4 provides merely an example of the many different types of functional arrangements that may be employed to implement the operation of the portion of the logic executed by the mislinked meter system 131 as described herein. As an alternative, the flowchart of FIG. 4 may be viewed as depicting an example of steps of a method implemented in the mislinked meter system 131 according to one or more embodiments. The non-limiting example of FIG. 4 depicts a mislinked meter system 131 that generates data from voltages reported by utility metering devices 102 (FIG. 1) to compare meters 138 (FIG. 1) to meters 138 linked to a same distribution transformer 144 (FIG. 1) in the data store 127 (FIG. 1).

At 403, the mislinked meter system 131 interpolates voltages from voltages 147 (FIG. 1) reported by utility metering devices 102. The voltages 147 reported from the utility metering devices 102 may be reported periodically. For example, the utility metering devices 102 may report voltage levels captured every four hours. The mislinked meter system 131 may estimate interim voltages. Interpolating interim voltages may increase accuracy by minimizing the effects of an abnormal voltage level. The interpolation of voltages may be linear interpolation, spline interpolation, polynomial interpolation, or any method by which intermediate voltages may be estimated.

At 406, the mislinked meter system generates a meter error for each one of the meters 138 associated with a distribution transformer 144 in the data store 127. The meter error represents the deviation from normal voltage levels for a meter 138. The more a meter 138 deviates from normal voltage levels when compared to other meters 138 linked to the same distribution transformer 144, the more likely the meter 138 is mislinked to the wrong distribution transformer 144. A meter 138 is mislinked to the wrong distribution transformer 144 when the meter 138 represents a utility metering device 102 that is physically linked to a physical distribution transformer 105 (FIG. 1) but the meter 138 is linked to a distribution transformer 144 that represents a different physical distribution transformer 105 in the data store 127.

Continuing with 406, the mislinked meter system 131 may generate the meter errors based at least in part on voltages 147 and the voltages interpolated at 403. A meter error is a deviation from normal voltage for a meter 138. For example, the mislinked meter system 131 may generate meter errors as an average of periodic meter errors for the meter 138. A periodic meter error is a deviation from the normal voltage for a meter at a period in time. For example, the periodic meter error may be a difference in the average voltage of meters 138 at a certain time of the day and the voltage of the respective one of the meters 138 at that time. In various embodiments, another value may be used in place of or in addition to the periodic meter error for establishing the normal voltage for meters 138. For example, a standard deviation, mean, median, or other value may represent the normal voltage for meters 138 at a point in time.

At 409, the mislinked meter system 131 may generate a transformer error for the distribution transformer 144. The transformer error represents the normal deviation of voltage for all or some meters 138 associated with the distribution transformer 144. The distribution transformer error facilitates a comparison between the meter error generated at 406 and the transformer error to indicate how much a meter 138 deviates from the normal of all or some meters 138 associated with the distribution transformer 144. The mislinked meter system 131 may generate the transformer error based at least in part on the meter errors of all or some meters 138 associated with a distribution transformer 144. For example, the mislinked meter system 131 may average, select the mean, select the median, generate the standard deviation, and/or otherwise analyze the meter errors generated at 406 to generate the transformer error.

At 412, the mislinked meter system 131 generates a normalized meter error for meters 138 associated with a distribution transformer 144. The normalized meter error standardizes the meter errors to simplify the analysis of which meters 138 differ from the normal voltage more than other meters 138 associated with the distribution transformer 144. The normalized meter error adjusts the meter error generated at 406 for the normal amount of error across the meters 138 associated with the distribution transformer 144. For example, the mislinked meter system 131 may generate the normalized meter error based at least in part on a ratio between the meter error for a meter 138 and the transformer error generated at 409. This represents how much the meter 138 varies from meters 138 associated with the distribution transformer. When the normalized meter error is a ratio, a meter 138 with no variance from the transformer error would have a normalized meter error of 1 because the division of the meter error by the transformer error is 1. Furthermore, meters 138 that vary more than the normal amount of voltage, i.e., the transformer error, would have a normalized meter error of greater than 1 because the meter error would exceed the transformer error. In various embodiments, the normalized meter error may be generated in any manner that normalizes the meter errors to be standard across meters 138 associated with the same distribution transformer 144, such as, for example, a difference between the meter error and the transformer error, a standard deviation between the meter error and the transformer error, or other calculations that reflect the relationship between the meter error of a meter 138 and the transformer error. Thereafter, this portion of the mislinked meter system 131 ends.

Figure 5:
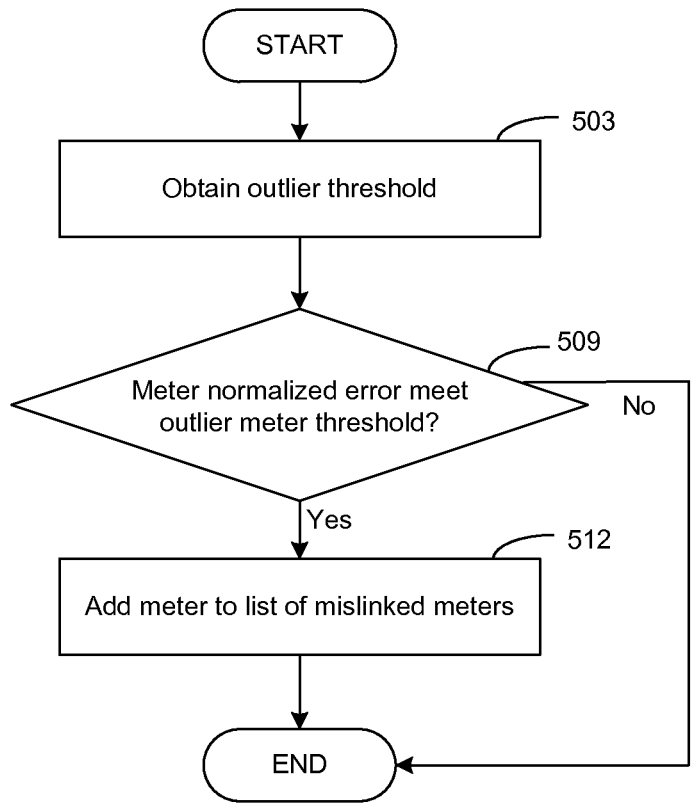
FIG. 5 is a flowchart illustrating one example of functionality implemented as other portions of the mislinked meter system executed in the utility metering and computing environment of FIG. 1.

Referring now to FIG. 5, shown is a flowchart that provides one example of the operation of a portion of the logic executed by the mislinked meter system 131, according to various embodiments. It is understood that the flowchart of FIG. 5 provides merely an example of the many different types of functional arrangements that may be employed to implement the operation of the portion of the logic executed by the mislinked meter system 131 as described herein. As an alternative, the flowchart of FIG. 5 may be viewed as depicting an example of steps of a method implemented in the mislinked meter system 131 according to one or more embodiments. The non-limiting example of FIG. 5 depicts a mislinked meter system 131 that identifies which meters 138 (FIG. 1) are more likely to mislinked to the wrong distribution transformer 144 (FIG. 1) in the data store 127 (FIG. 1).

At 503, the mislinked meter system 131 obtains an outlier threshold. The outlier threshold represents the voltage deviation from a normal voltage level of meters associated with a distribution transformer 144 at which meters 138 are likely to be mislinked to the wrong distribution transformer 144. The outlier threshold may be a predefined outlier threshold 145 (FIG. 1) in the data store 127 or it may be otherwise determined. For example, the outlier threshold may be derived from the normalized meter errors of the meter 138 associated with the same distribution transformer 144. In this case, the outlier threshold may identify a percentage of meters 138 that meet a normalized meter error. For example, meters 138 having a normalized meter error that meet an outlier threshold of a certain percentile, such as the top 25%, may be identified. In various embodiments, the outlier threshold 145 may be obtained from any source that can identify the divide between meters 138 that are likely correctly linked to a distribution transformer 144 and the meters 138 that are mislinked to the wrong distribution transformer 144.

At 509, the mislinked meter system 131 compares the normalized meter errors of meters 138 to the outlier threshold. If the normalized meter error meets the outlier threshold, the mislinked meter system 131 proceeds to 512. At 512, the mislinked meter system 131 adds the respective meter 138 to a mislinked meters list. In various embodiments, the mislinked meter system 131 may otherwise identify the meter 138 as mislinked to the wrong distribution transformer 144 in the data store 127. Thereafter, this portion of the mislinked meter system ends. If the normalized meter error does not meet the outlier threshold at 509, this portion of the mislinked meter system 131 ends.

Figure 6:
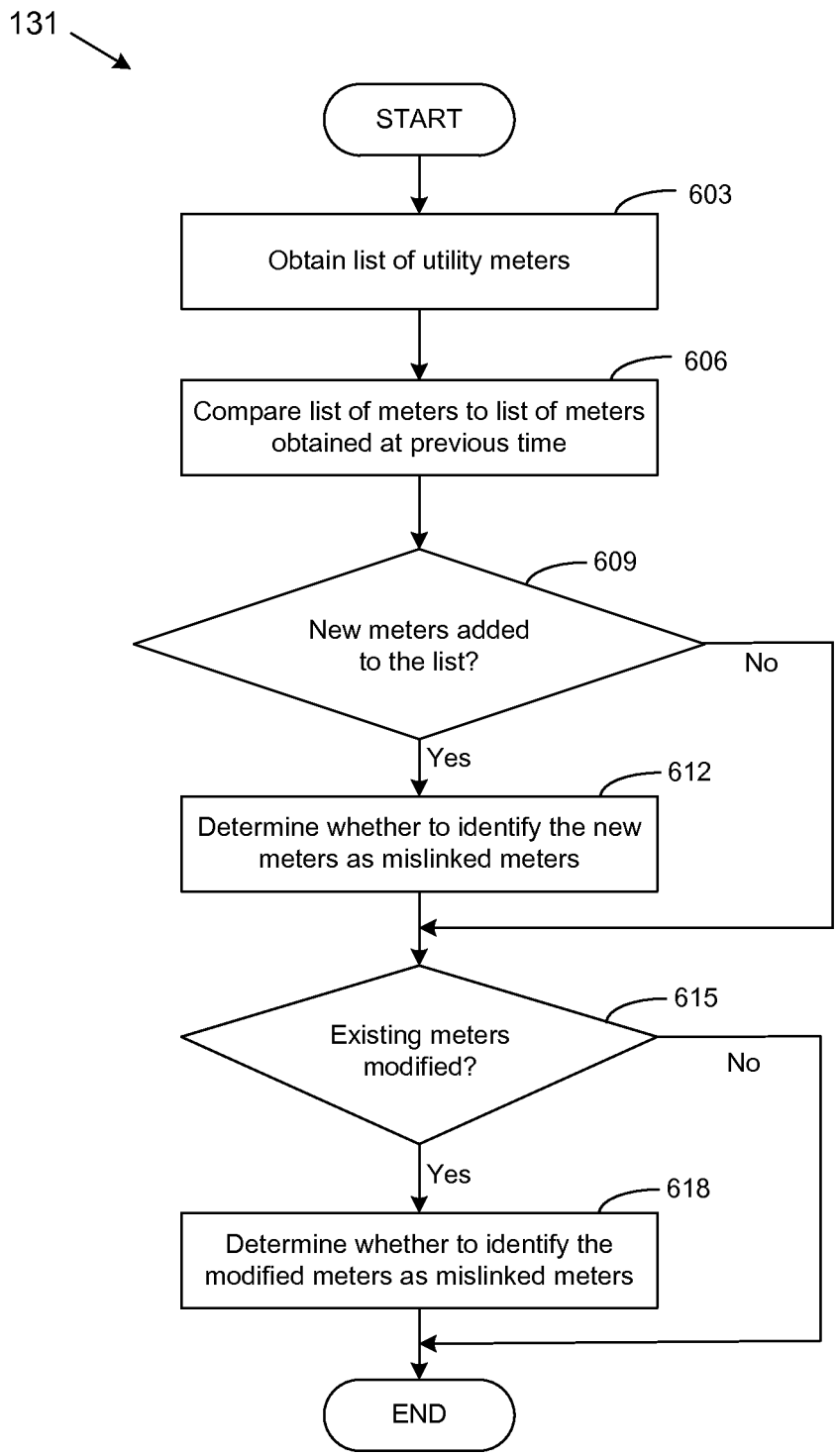
FIG. 6 is a flowchart illustrating one example of functionality implemented as other portions of the mislinked meter system executed in the utility metering and computing environment of FIG. 1.

Turning now to FIG. 6, shown is a flowchart that provides one example of the operation of a portion of the logic executed by the mislinked meter system 131, according to various embodiments. It is understood that the flowchart of FIG. 6 provides merely an example of the many different types of functional arrangements that may be employed to implement the operation of the portion of the logic executed by the mislinked meter system 131 as described herein. As an alternative, the flowchart of FIG. 6 may be viewed as depicting an example of steps of a method implemented in the mislinked meter system 131 according to one or more embodiments. The non-limiting example of FIG. 6 depicts a mislinked meter system 131 that identifies which meters 138 (FIG. 1) to evaluate for whether they are mislinked to the wrong distribution transformer 144 (FIG. 1) in the data store 127 (FIG. 1).

At 603, the mislinked meter system 131 obtains a list of utility meters. The list of utility meters may be all or a subset of meters 138. For example, the list of utility meters may comprise meters 138 associated with one or more distribution transformers 144. The list of utility meters may be obtained from the data store 127 or another source that may identify utility meters that should be evaluated for whether the meters 138 are mislinked to the wrong distribution transformer 144.

At 606, the mislinked meter system 131 compares the list of utility meters obtained at 603 to a previously obtained list of utility meters. The previously obtained list of utility meters was obtained from the same source and had the same parameters for the list as the list obtained at 603. For example, both lists may comprise meters 138 associated with certain distribution transformers 144.

At 609, the mislinked meter system 131 evaluates whether new meters have been added to the list obtained at 603 when compared to the previously obtained list. If new meters have been added, the mislinked meter system proceeds to 612. If new meters have not been added, the mislinked meter system 131 proceeds to 615.

At 612, the mislinked meter system 131 determines whether the newly added meters should be identified as mislinked. See the discussion above concerning FIG. 4 and FIG. 5.

At 615, the mislinked meter system 131 evaluates whether meters in the list obtained at 603 have been modified. For example, the mislinked meter system 131 may identify meters 138 that have been modified to be associated with a different distribution transformer 144, thus potentially mislinking the meters 138 to the wrong distribution transformer 144. In various embodiments, the mislinked meter system 131 may identify meters as modified based at least in part on other changes that may result in the meters being mislinked to the wrong distribution transformer 144. If some or all of the meters have been modified, the mislinked meter system 131 proceeds to 618. If none of the meters have been modified, this portion of the mislinked meter system 131 ends.

At 618, the mislinked meter system 131 determines whether the modified meters should be identified as mislinked. See the discussion above concerning FIG. 4 and FIG. 5. Thereafter, this portion of the mislinked meter system 131 ends.

Figure 7:
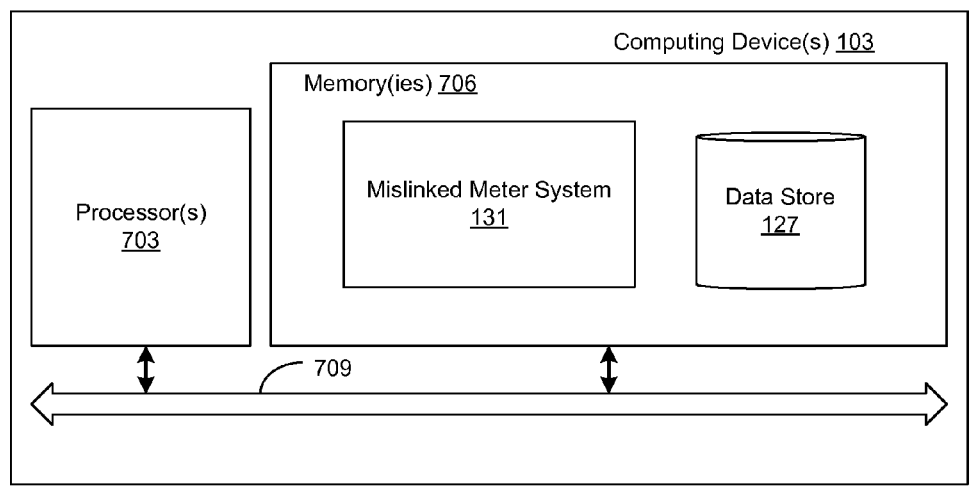
FIG. 7 is a schematic block diagram that provides one example of a computing device in which the mislinked meter system of FIG. 1 may be implemented, according to various embodiments of the present disclosure.

With reference to FIG. 7, shown is a schematic block diagram of a computing device 103 according to various embodiments of the present disclosure. The computing device 103 includes at least one processor circuit, for example, having a processor 703 and a memory 706, both of which are coupled to a local interface 709. To this end, the computing device 103 may comprise, for example, at least one server computer or like device. The local interface 709 may comprise, for example, a data bus with an accompanying address/control bus or other bus structure as can be appreciated.

Stored in the memory 706 are both data and several components that are executable by the processor 703. In particular, stored in the memory 706 and executable by the processor 703 is a mislinked meter system 131. Also stored in the memory 706 may be data stored in the data store 127.

It is understood that there may be other applications that are stored in the memory 706 and are executable by the processor 703 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Delphi®, Flash®, or other programming languages.

A number of software components are stored in the memory 706 and are executable by the processor 703. In this respect, the term "executable" means a program file that is in a form that can ultimately be run by the processor 703. Examples of executable programs may be, for example, a compiled program that can be translated into machine code in a format that can be loaded into a random access portion of the memory 706 and run by the processor 703, source code that may be expressed in proper format such as object code that is capable of being loaded into a random access portion of the memory 706 and executed by the processor 703, or source code that may be interpreted by another executable program to generate instructions in a random access portion of the memory 706 to be executed by the processor 703. An executable program may be stored in any portion or component of the memory 706 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 706 is defined herein as including both volatile and nonvolatile memory and data storage components. Volatile components are those that do not retain data values upon loss of power. Nonvolatile components are those that retain data upon a loss of power. Thus, the memory 706 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 703 may represent multiple processors 703 and the memory 706 may represent multiple memories 706 that operate in parallel processing circuits. In such a case, the local interface 709 may be an appropriate network that facilitates communication between any two of the multiple processors 703, between any processor 703 and any of the memories 706, or between any two of the memories 706. The local interface 709 may comprise additional systems designed to coordinate this communication, including, for example, performing load balancing. The processor 703 may be of electrical or of some other available construction.

Although the mislinked meter system 131 and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application-specific integrated circuits having appropriate logic gates, or other components. Such technologies are generally well known by those skilled in the art and, consequently, are not described in detail herein.

The flowcharts of FIGS. 4, 5, and 6 show the functionality and operation of an implementation of portions of the mislinked meter system 131. If embodied in software, each reference number, depicted as a block, may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 703 in a computer system or other system. The machine code may be converted from the source code. If embodied in hardware, each block may represent a circuit or a number of interconnected circuits to implement the specified logical function(s).

Although the flowcharts of FIGS. 4, 5, and 6 show a specific order of execution, it is understood that the order of execution may differ from that which is depicted. For example, the order of execution of two or more blocks may be scrambled relative to the order shown. Also, two or more blocks shown in succession in FIGS. 4, 5, and 6 may be executed concurrently or with partial concurrence. Further, in some embodiments, one or more of the blocks shown in FIGS. 4, 5, and 6 may be skipped or omitted. In addition, any number of counters, state variables, warning semaphores, or messages might be added to the logical flow described herein for purposes of enhanced utility, accounting, performance measurement, or providing troubleshooting aids. It is understood that all such variations are within the scope of the present disclosure.

Also, any logic or application described herein, including the mislinked meter system 131, that comprises software or code can be embodied in any non-transitory computer-readable medium for use by or in connection with an instruction execution system such as, for example, a processor 703 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM), dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A non-transitory computer-readable medium embodying a program executable in at least one computing device, wherein, when executed, the program causes the at one computing device to at least:
   interpolate a plurality of interpolated voltages from a plurality of voltages associated with a utility meter;
   generate a periodic voltage average comprising an average of the plurality of interpolated voltages;
   generate a plurality of periodic meter errors, each one of the plurality of periodic meter errors based at least in part on a difference between the periodic voltage average and one of the plurality of interpolated voltages;
   generate a meter error for the utility meter comprising an average of the plurality of periodic meter errors;
   generate a transformer error comprising an average of the meter error and a plurality of other meter errors corresponding to a plurality of other utility meters, wherein the utility meter and each one of the plurality of other utility meters are associated with a same distribution transformer;
   generate a normalized meter error comprising the meter error divided by the transformer error; and
   add the utility meter to a mislinked meter list in response to the normalized meter error meeting a predefined threshold of a plurality of other normalized meter errors corresponding to the plurality of other utility meters.

2. The non-transitory computer-readable medium of claim 1, wherein the plurality of interpolated voltages are interpolated based at least in part on a linear interpolation.

3. The non-transitory computer-readable medium of claim 1, wherein the utility meter comprises a modified meter modified during a predefined timeframe.

4. A system, comprising:
   at least one computing device;
   at least two utility meters associated with a distribution transformer; and
   a program executed in the at least one computing device, wherein the program, when executed, causes the at least one computing device to at least:
      generate a plurality of meter errors for at least one of the at least two utility meters, wherein at least one of the plurality of meter errors comprises an average of a plurality of differences between an average of a plurality of voltages associated with a respective one of the at least two utility meters and ones of the plurality of voltages;
      generate a transformer error based at least in part on the plurality of meter errors; and
      identify at least one outlier meter based at least in part on a plurality of ratios between the transformer error and ones of the plurality of meter errors.

5. The system of claim 4, wherein the program, when executed, further causes the at least one computing device to at least interpolate the plurality of voltages from a plurality of captured voltages reported by the at least two utility meters.

6. The system of claim 5, wherein the interpolation comprises linear interpolation.

7. The system of claim 5, wherein the interpolation comprises spline interpolation.

8. The system of claim 4, wherein the transformer error comprises an average of the plurality of meter errors.

9. The system of claim 4, wherein the program, when executed, further causes the at least one computing device to at least identify the at least two utility meters based at least in part on a plurality of new meters added to a list of a plurality of all meters associated with the distribution transformer since the list was last obtained.

10. The system of claim 4, wherein the program, when executed, further causes the at least one computing device to at least identify the at least two utility meters based at least in part on a plurality of modified meters modified in a list of a plurality of all meters associated with the distribution transformer since the list was last obtained.

11. The system of claim 10, wherein the modification comprises linking a one of the plurality of all meters to a different distribution transformer.

12. The system of claim 4, wherein a quantity of the at least one outlier meter corresponds to a predefined percentage of the at least two utility meters associated with the distribution transformer.

13. The system of claim 4, wherein the at least one outlier meter is associated with ones of the plurality of ratios that meet a predefined threshold.

14. A method, comprising:
   identifying outlying ones of a plurality of utility meters associated with a distribution transformer based at least in part on a plurality of normalized meter errors, wherein at least one of the plurality of normalized meter errors is based at least in part on:
      individual ones of a plurality of periodic meter errors associated with a respective one of the plurality of utility meters, the individual ones of the plurality of periodic meter errors comprising a difference between an average of a plurality of voltages associated with the respective one of the plurality of utility meters and a one of the plurality of voltages;
      a respective one of a plurality of meter errors associated with the respective one of the plurality of utility meters, the respective one of the plurality of meter errors being based at least in part on an average of the ones of the plurality of periodic meter errors associated with the respective one of the plurality of utility meters; and
      a transformer error based at least in part on an average of the plurality of meter errors.

15. The method of claim 14, further comprising adding, in response to a one of the plurality of normalized meter errors meeting a threshold, a respective one of the plurality of utility meters to a mislinked meter list.

16. The method of claim 14, identifying the plurality of utility meters based at least in part on a change to an association between the respective one of the plurality of utility meters and the distribution transformer.

17. The method of claim 16, further comprising interpolating the plurality of voltages from a plurality of reported voltages, individual ones of the plurality of reported voltages being reported by one of the plurality of utility meters.

18. The method of claim 17, wherein the interpolation comprises linear interpolation.

19. The method of claim 17, wherein the interpolation comprises spline interpolation.

20. The method of claim 14, further comprising generating individual ones of the plurality of normalized meter errors based at least in part on a ratio of the respective one of the plurality of meter errors to the transformer error.

* * * * *